(12) United States Patent
Nishiyama

(10) Patent No.: US 6,420,936 B1
(45) Date of Patent: Jul. 16, 2002

(54) POWER CONTROLLER AND POWER CONTROLLING METHOD

(75) Inventor: Yoshikazu Nishiyama, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/940,656

(22) Filed: Aug. 29, 2001

(30) Foreign Application Priority Data

Aug. 29, 2000 (JP) ....................................... 2000-258479

(51) Int. Cl.$^7$ ................................................ H03F 3/04
(52) U.S. Cl. ...................................... 330/297; 323/313
(58) Field of Search .......................... 330/297; 323/313, 323/314

(56) References Cited

U.S. PATENT DOCUMENTS

| | | | | |
|---|---|---|---|---|
| 4,435,846 A | * | 3/1984 | Weise | 455/253 |
| 5,903,142 A | * | 5/1999 | Mann | 323/313 |
| 6,031,413 A | * | 2/2000 | Mizoguchi | 327/538 |
| 6,064,227 A | | 5/2000 | Saito | |
| 6,191,967 B1 | | 2/2001 | Katayama et al. | |
| 6,259,324 B1 | * | 7/2001 | Antegnetti et al. | 330/296 |

FOREIGN PATENT DOCUMENTS

| | | |
|---|---|---|
| EP | 0 748 045 A2 | 12/1996 |
| JP | A 8-335862 | 12/1996 |
| JP | A 10-65516 | 3/1998 |
| JP | A 10-294662 | 11/1998 |
| JP | A 11-327500 | 11/1999 |

* cited by examiner

Primary Examiner—Robert Pascal
Assistant Examiner—Henry Choe
(74) Attorney, Agent, or Firm—Young & Thompson

(57) ABSTRACT

A power controller comprises: a first control signal generator operable with a second power voltage for generating a first control signal; a first reference voltage generator operable with a first power voltage for generating a first reference voltage corresponding to a difference between the first and second power voltages; a first level converter coupled with the first control signal generator for receiving the first control signal, the first level converter coupled with the first reference voltage generator for converting the first control signal into a first level-converted control signal with a voltage level range between the first power voltage and the difference between the first and second power voltages; and a first driver coupled with the first level converter for receiving the first level-converted control signal, and the first driver driving an external load with the first level-converted control signal.

8 Claims, 8 Drawing Sheets

POWER CONTROLLER AND POWER CONTROLLING METHOD

BACKGROUND OF THE INVENTION

1. Field of the Invention

The present invention relates to a power controller and a power control method, and more particularly to a power controller and a power control method, which are suitable for an integrated battery power system for vehicle.

2. Description of the Related Art

A power controller is used for solenoid driving in the battery power system for vehicles. The power controller is operated with a power supply at 12V from the battery on the vehicles. The power controller comprises MOS transistors having a high drain source withstand voltage and a high gate source withstand voltage for a high voltage of 12V.

FIG. 1 is a block diagram illustrative of a conventional power controller operable with 12V. The conventional power controller 80 has a control circuit 85, an output circuit 84 and an external load 86. The control circuit 85 generates a control signal upon receiving an input signal. The control signal is supplied to the output circuit 84. The output circuit 84 switches ON and OFF in accordance with the control signal for driving the external load 86. A maximum variation width in voltage level of the control signal is 12V. For this reason, the conventional power controller 80 comprises the transistors with the high drain source withstand voltage of 12V and the high gate source withstand voltage of 12V.

The power controller may sometime be integrated with a logic circuit operable with 5V over a single wafer for the purpose of cost reduction and size and weight reductions. In this case, the manufacturing process for the logic circuit is the base process, and the power controller operable with 12V is formed by additional processes. These additional processes make it difficult to reduce the manufacturing cost.

Japanese laid-open patent publications Nos. 10-65516 and 11-327500 disclose the use of a level converter circuit for ON-OFF control of the switching transistors provided in the high voltage power side, wherein additional circuit elements are provided, for example, a highly accurate voltage detector and a controller in the high voltage power side. These additional circuit elements make it difficult to increase the density of integration. These additional circuit elements may be hard to co-operate with the control circuit in the low voltage power side.

In the above circumstances, the development of a novel power controller and a power control method free from the above problems is desirable.

SUMMARY OF THE INVENTION

Accordingly, it is an object of the present invention to provide a novel power controller free from the above problems.

It is a further object of the present invention to provide a novel power controller suitable to be integrated with another circuit operable with a different power voltage from the power controller over a single wafer for a possible manufacturing cost reduction and possible size and weight reductions.

It is a still further object of the present invention to provide a novel power controller suitable to be integrated with another circuit operable with a different power voltage from the power controller over a single wafer for allowing additional circuit elements such as highly accurate voltage detector and controller in a high voltage power side without for realizing multi-functions, however, making the circuit configuration complicated.

It is yet a further object of the present invention to provide a novel power control method free from the above problems It is a further object of the present invention to provide a novel power control method suitable to be integrated with another circuit operable with a different power voltage from the power controller over a single wafer for a possible manufacturing cost reduction and possible size and weight reductions.

It is a still further object of the present invention to provide a novel power control method suitable to be integrated with another circuit operable with a different power voltage from the power controller over a single wafer for allowing additional circuit elements such as highly accurate voltage detector and controller in a high voltage power side without for realizing multi-functions, however, making the circuit configuration complicated.

The present invention provides a power controller operable with at least a first power voltage and a second power voltage lower than the first power voltage. The power controller comprises: a first control signal generator operable with the second power voltage for generating a first control signal; a first reference voltage generator operable with the first power voltage for generating a first reference voltage which corresponds to a difference between the first and second power voltages; a first level converter being electrically coupled with the first control signal generator for receiving the first control signal, the first level converter being electrically coupled with the first reference voltage generator for receiving the first reference voltage, the first level converter converting the first control signal into a first level-converted control signal with a voltage level range between the first power voltage and the difference between the first and second power voltages; and a first driver electrically coupled with the first level converter for receiving the first level-converted control signal, and the first driver driving an external load in accordance with the first level-converted control signal.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DETAILED DESCRIPTION OF THE PREFERRED EMBODIMENTS

A first aspect of the present invention is a power controller operable with at least a first power voltage and a second power voltage lower than the first power voltage. The power controller comprises: a first control signal generator operable with the second power voltage for generating a first control signal; a first reference voltage generator operable with the first power voltage for generating a first reference voltage which corresponds to a difference between the first and second power voltages; a first level converter being electrically coupled with the first control signal generator for receiving the first control signal, the first level converter being electrically coupled with the first reference voltage generator for receiving the first reference voltage, the first level converter converting the first control signal into a first level-converted control signal with a voltage level range between the first power voltage and the difference between the first and second power voltages; and a first driver electrically coupled with the first level converter for receiving the first level-converted control signal, and the first driver driving an external load in accordance with the first level-converted control signal.

It is preferable that the first reference voltage generator includes a band gap reference circuit.

It is preferable to further comprise a detector electrically coupled with the first reference voltage generator for receiving the first reference voltage, and the detector being biased between the first power voltage and the first reference voltage for performing a detecting operation.

It is further preferable that the detector is electrically coupled with the first driver and the external load for detecting states of the first driver and the external load.

It is preferable to further comprise a second level converter being electrically coupled with the detector for receiving a detected signal, and the second level converter converts a level-converted detected signal with a voltage level range between a ground level and the second power voltage level.

It is further more preferable that the second level converter being electrically coupled with the first control signal generator for supplying the level-converted detected signal to the first control signal generator.

It is preferable to further comprise a waveform shaping circuit electrically coupled between the first level converter and the first driver for shaping the level converted control signal and supplying a waveform-shaped control signal to the first driver. It is further preferable that the waveform shaping circuit is operated with a bias between the first power voltage and the first reference voltage.

FIRST EMBODIMENT

Figure 1:
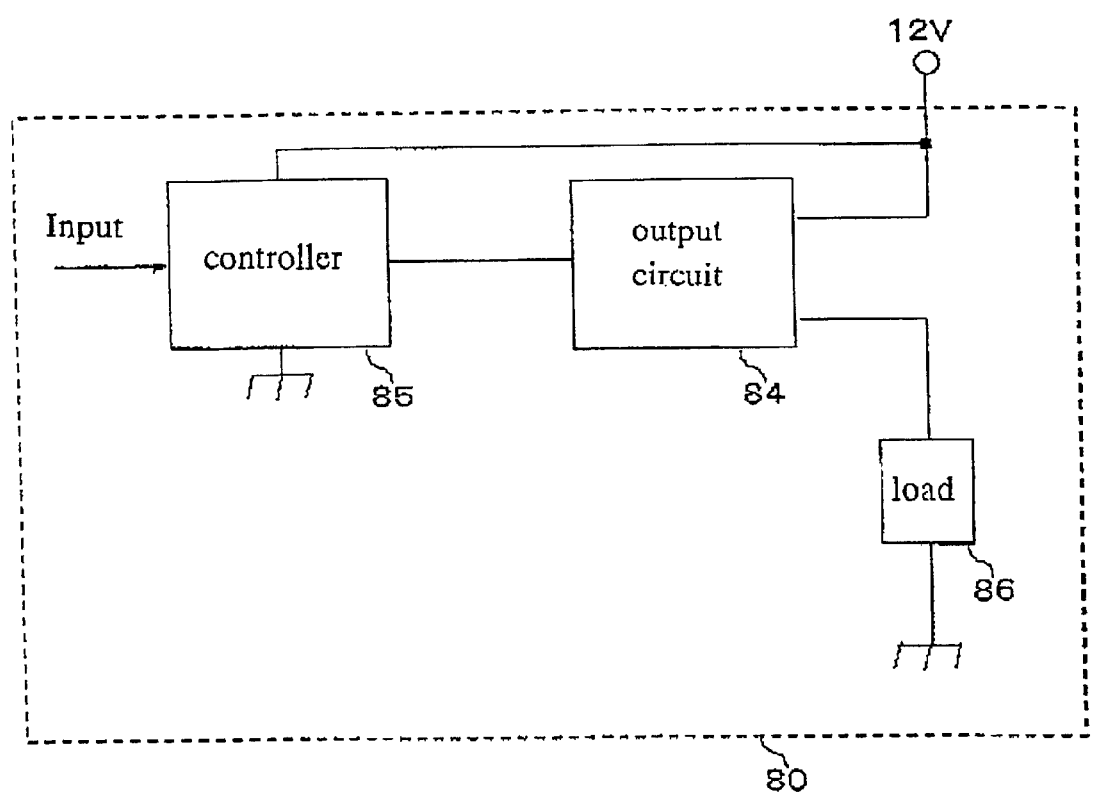
FIG. 1 is a block diagram illustrative of a conventional power controller operable with 12V.
Figure 2:
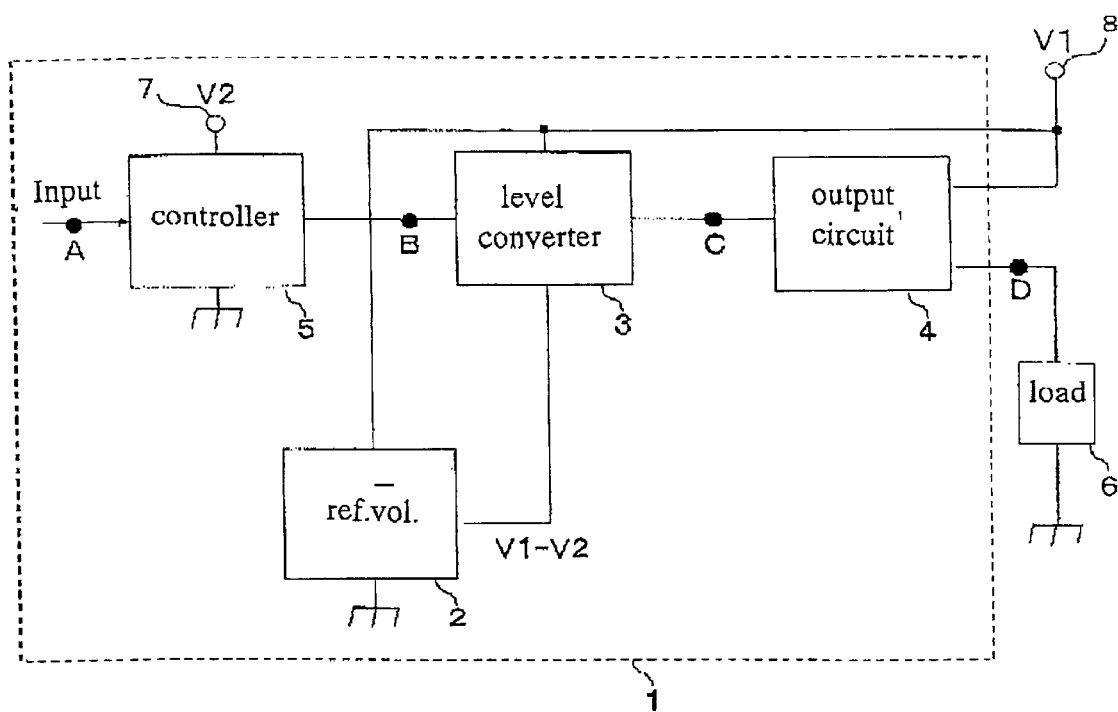
FIG. 2 is a block diagram illustrative of a novel power controller in a first embodiment in accordance with the present invention.

A first embodiment according to the present invention will be described in detail with reference to the drawings. FIG. 2 is a block diagram illustrative of a novel power controller in a first embodiment in accordance with the present invention. A power controller 1 includes a control circuit 5, a reference voltage generator circuit 2, a level converter circuit 3, and an output circuit 4, which are integrated on a single semiconductor substrate which is not illustrated. A first power voltage V1 is supplied via a first power input terminal 8 to the reference voltage generator circuit 2, the level converter circuit 3, and the output circuit 4. A second power voltage V2 is supplied via a second power input terminal 7 to the control circuit 5. The power controller 1 is operable with different two power voltages V1 and V2 with reference to reference voltage level which is the ground level, wherein an absolute value of the first power voltage is larger than another absolute value of the second power voltage.

The control circuit 5 is operable with the second power voltage V2 to generate a control signal "B" upon receipt of an input signal "A". The control signal "B" is supplied to the level converter circuit 3. The reference voltage generator circuit 2 generates a virtual reference voltage V1−V2 based on the first power voltage, wherein the virtual reference voltage V1−V2 corresponds to a difference in absolute value between the first and second power voltages. The virtual reference voltage V1−V2 is then supplied to the level converter circuit 3, so that the virtual reference voltage V1−V2 serves as a virtual ground voltage for the level converter circuit 3. The level converter circuit 3 receives the control signal "B" from the control circuit 5, so that the level converter circuit 3 converts the control signal "B" in voltage level to a level-converted control signal "C" with reference to the virtual reference voltage V1−V2. The level-converted control signal "C" is supplied to the output circuit 4, so that transistors of the output circuit 4 show ON-OFF operations based on the level-converted control signal "C" for generating a control signal "D" for driving an internal load 6. P-channel MOS transistors with gate threshold voltages of not more than the second power voltage 2V may be used for the output circuit 4. The power controller comprises transistors having a withstanding voltage which is higher than the second power voltage by a power voltage variation range.

Figure 3:
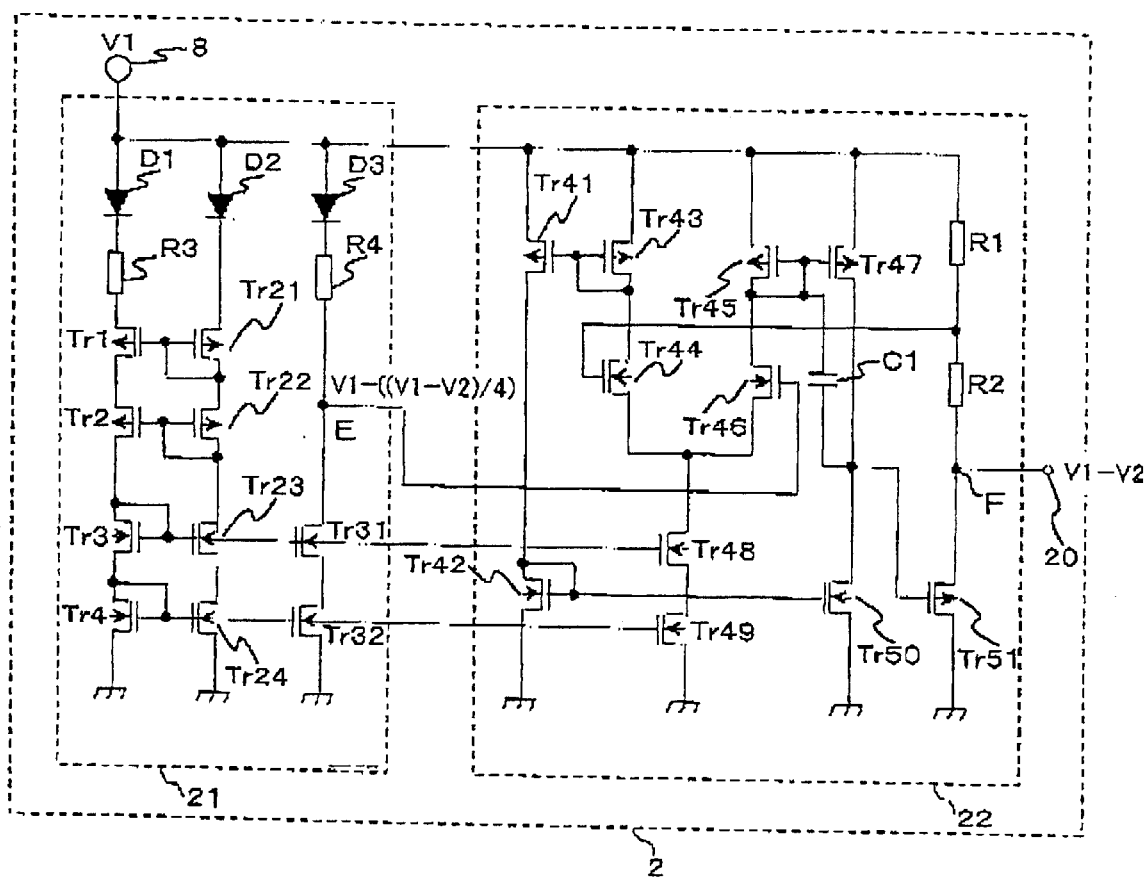
FIG. 3 is a circuit diagram illustrative of a circuit configuration of the reference voltage generator circuit of the power controller of FIG. 2.
Figure 4:
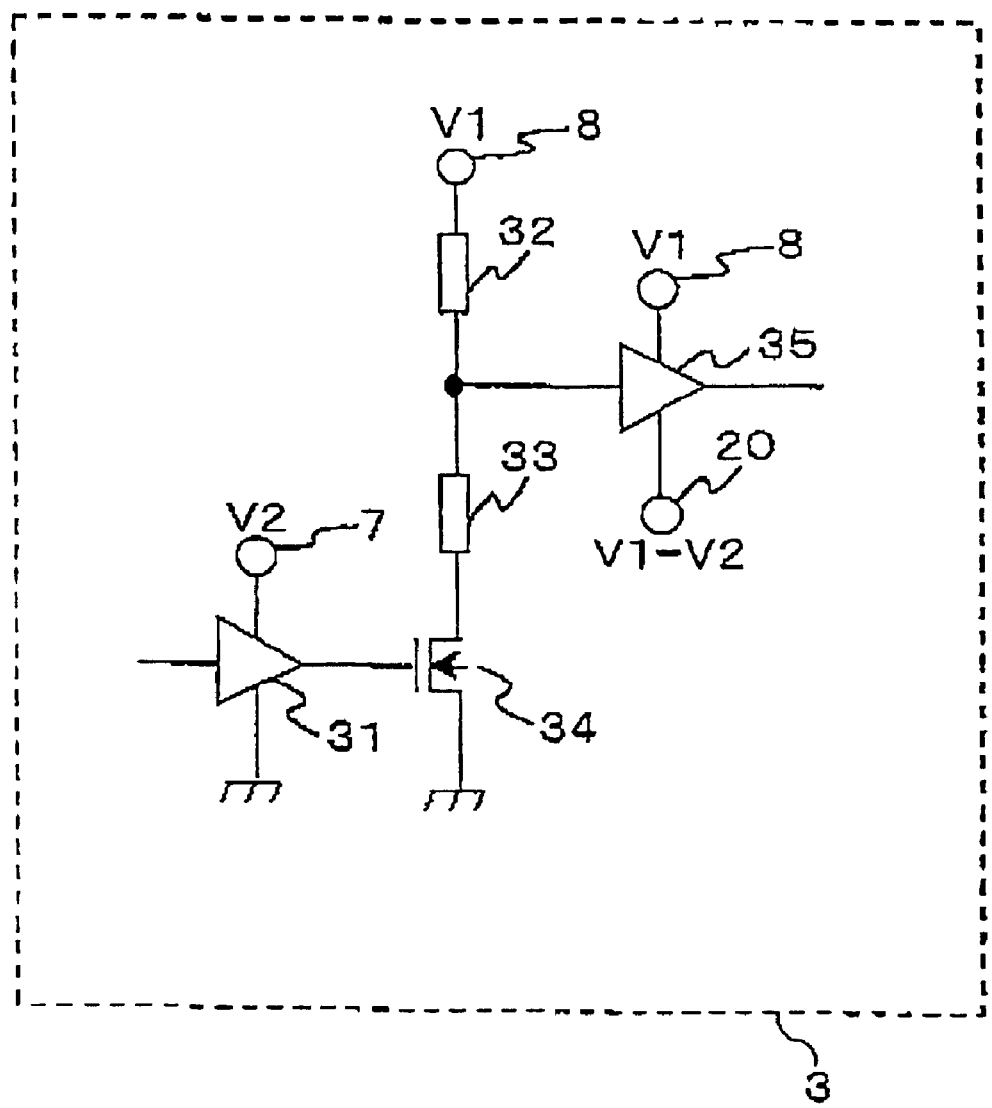
FIG. 4 is a circuit diagram illustrative of a circuit configuration of the level converter circuit of the power controller of FIG. 2.

The followings are examples of the circuit configurations of the reference voltage generator circuit 2 and the level converter circuit 3, each of which comprises the transistors having the gate-source withstand voltages higher than the second power voltage by a power voltage variation range. FIG. 3 is a circuit diagram illustrative of a circuit configuration of the reference voltage generator circuit of the power controller of FIG. 2. FIG 4 is a circuit diagram illustrative of a circuit configuration of the level converter circuit of the power controller of FIG. 2.

With reference to FIG. 3, the reference voltage generator circuit 2 comprises a band gap reference circuit 21 and an differential amplifier circuit 22. The hand gap reference circuit 21 comprises three diodes D1, D2, and D3, two resistances R3 and R4, four p-channel MOS transistors Tr1, Tr2, Tr21, and Tr22, six n-channel MOS transistors Tr3, Tr4, Tr23, Tr24, Tr31, and Tr32. Anodes of the diodes D1, D2, and D3 are connected to the first input terminal 8 applied with the first power voltage V1. A cathode of the diode D1 is connected in series through the resistance R3 and a series connection of the transistors Tr1, Tr2, Tr3 and Tr4 to a ground. A cathode of the diode D2 is connected in series through another series connection of the transistors Tr21, Tr22, Tr23 and Tr24 to the ground. A cathode of the diode D3 is connected in series through the resistance R4 and a series connection of the transistors Tr31 and Tr32 to the ground.

Gates of the transistors Tr1 and Tr21 are commonly connected to a drain of the transistor Tr21. Gates of the transistors Tr2 and Tr22 are commonly connected to a drain of the transistor Tr22. Gates of the transistors Tr3, Tr23 and Tr31 are commonly connected to a drain of the transistor Tr3. Gates of the transistors Tr4, Tr24 and Tr32 are commonly connected to a drain of the transistor Tr4. An output node "E" of the band gap reference circuit 21 is positioned between the resistance R4 and the transistor Tr31.

The differential amplifier circuit 22 comprises two resistances R1 and R2, five p-channel MOS transistors Tr41, Tr43, Tr45, Tr47 and Tr51, six n-channel MOS transistors Tr42, Tr44, Tr46, Tr48, Tr49 and Tr50, and a single capacitor C1.

The first input terminal 8 applied with the first power voltage V1 is connected to sources of the transistors Tr41, Tr43, Tr45, and Tr47 and the resistance R1. A drain of the transistor Tr41 is connected through the transistor Tr42 to a ground. A drain of the transistor Tr43 is connected to a drain of the transistor Tr44. A drain of the transistor Tr45 is connected to a drain of the transistor Tr46. A source of the transistor Tr44 is connected to a source of the transistor Tr46. The sources of the transistors Tr44 and Tr46 are connected through a series connection of the transistors Tr48 and Tr49 to the ground. A drain of the transistor Tr47 is connected through the transistor Tr50 to the ground. The resistance R1 is connected through the resistance R2 to an output node "F". A gate of the transistor Tr44 is connected to an intermediate point between the resistances R1 and R2. The transistor Tr51 is connected between the output node "F" and the ground. A gate of the transistor Tr51 is connected to a drain of the transistor Tr50. The drain of the transistor Tr50 is connected through the capacitor C1 to the gates of the transistors Tr45 and Tr47 and also to the drains of the transistors Tr45 and Tr46. The drains of the transistors Tr45 and Tr46 are also connected to the gates of the transistors Tr45 and Tr47. A gate of the transistor Tr50 is connected to a gate and a drain of the transistor Tr42. A gate of the transistor Tr46 is connected to the output node "E" of the band gap reference circuit 21. A gate of the transistor Tr48 is connected to the gates of the transistors Tr3, Tr23 and Tr31 in the band gap reference circuit 21. A gate of the transistor Tr49 is connected to the gates of the transistors Tr4, Tr24 and Tr32 in the band gap reference circuit 21.

A voltage given by V1−((V1−V2)/4) appears on the output node "E" of the band gap reference circuit 21. The voltage V1−((V1−V2)/4) is supplied to the differential amplifier circuit 22. A ratio in resistance values of the resistance R1 to the resistance R2 is 1:3. A voltage given by V1−V2 appears on the output node "F" of the differential amplifier circuit 22. The reference voltage generator circuit 2 generates the voltage V1−V2 based on the first voltage level V1. The reference voltage generator circuit 2 has an extremely high accuracy in voltage level of the output voltage, and an extremely small temperature dependency of the output voltage.

With reference to FIG. 4, the level converter circuit 3 comprises two buffer circuits 31 and 35, two resistances 32 and 33 and a single n-channel MOS transistor 34. A +-power terminal of the buffer circuit 31 is connected to the second power input terminal 7 applied with the second power voltage V2. An −-power terminal of the buffer circuit 31 is connected to the ground. A series connection of the resistances 32 and 33 and the transistor 34 is interposed between the first power input terminal 8 applied with the first power voltage V1 and the ground. A gate of the transistor 34 is connected to an output of the buffer circuit 31. An intermediate point between the resistances 32 and 33 is connected to an input of the buffer circuit 35. A +-power terminal of the buffer circuit 35 is connected to the first power input terminal 8 applied with the first power voltage V1 An −-power terminal of the buffer circuit 35 is connected to the output terminal 20 of the above reference voltage generator circuit 22, so that the −power terminal of the buffer circuit 35 is applied with the voltage given by V1−V2. An input of the buffer circuit 31 is connected to the output of the control circuit 5 for receiving an input of the control signal "B" from the control circuit 5 shown in FIG. 2.

The level converter circuit 3 converts the control signal "B" in voltage level to the level-converted control signal "C" with reference to the voltage V1−V2. Namely, the level converter circuit 3 adjusts the voltage power differences between the first and second power voltages. As a modification, the level converter circuit 3 may be free of the buffer circuit 31, wherein the control voltage with the 0V-reference from the control circuit 5 is supplied to the gate of the transistor 34.

The control circuit 5 may comprise a combination of a counter and a comparator.

Figure 5:
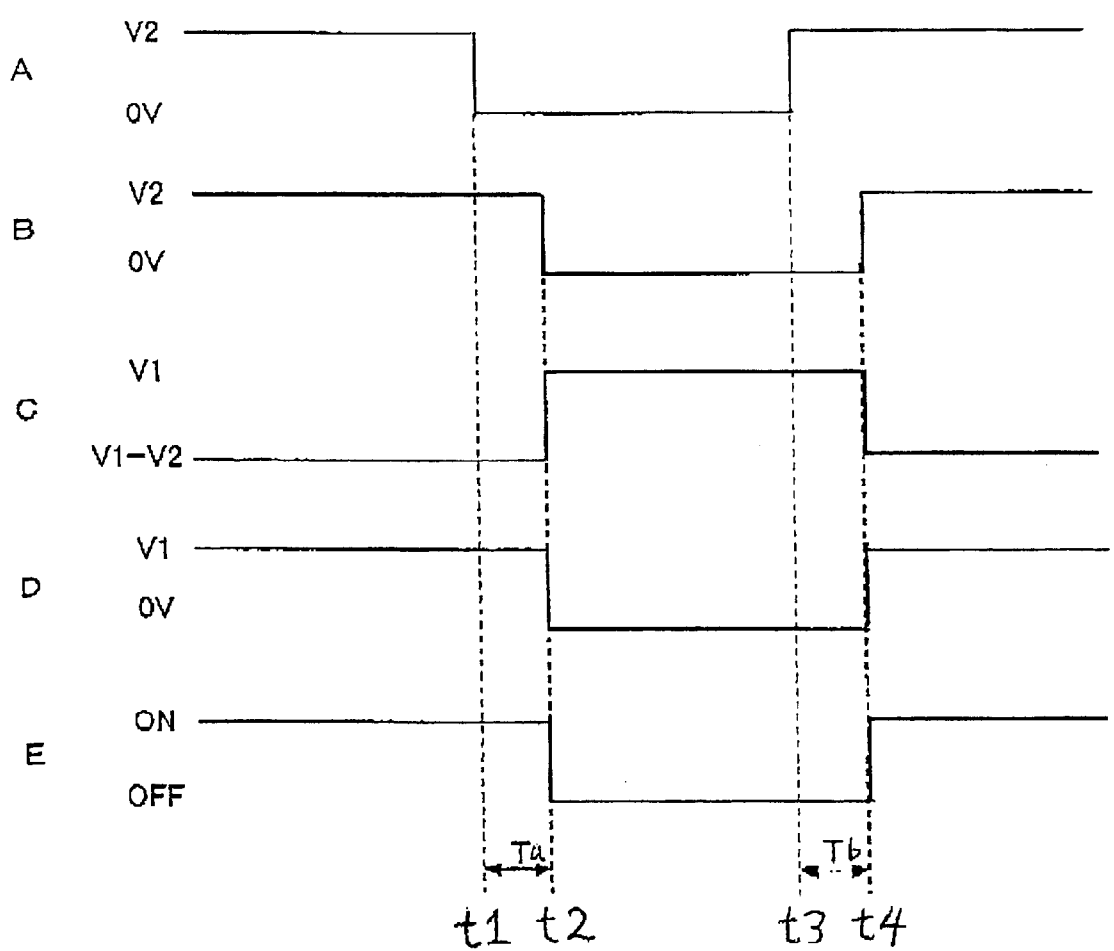
FIG. 5 is a timing chart of operations of the power controller of FIG. 2.

Operations of the above described power controller will be described. FIG. 5 is a timing chart of operations of the power controller of FIG. 2, wherein waveforms of nodes "A", "B", "C", "D" and "E" are illustrated. "E" represents the operations of the external load 6.

The control circuit 5 receives the input signal with the 0V-reference at a time t1, and then generates the control signal at a time t2, so that the control signal is inputted into the level converter circuit 3. The level converter circuit 3 converts the control signal with the 0V-reference into the level-converted control signal with reference to the reference voltage V1−V2, and outputs the level-converted control signal therefrom. The level-converted control signal is inputted into the output circuit 4. The output signal from the output circuit 4 varies in level depending on the level-converted control signal. The output signal from the output circuit 4 is supplied to the external load 6, whereby the external load 6 shows the ON-OFF switching operations.

The output circuit 4 comprises the p-channel MOS transistors having the gate threshold voltage of not higher than the second power voltage V2. If the level-converted control signal has the first power voltage level V1, a voltage difference between gate and source of the transistors of the output circuit 4 becomes 0V, whereby the transistors turn OFF. At this time, the output signal from the output circuit 4 is 0V, whereby the external load 6 is placed in OFF-state. If the level-converted control signal has the voltage given by V1−V2, the voltage difference between gate and source of the transistors of the output circuit 4 becomes the second power voltage V2, whereby the transistors turn ON. At this time, the output signal from the output circuit 4 is the first power voltage level V1, whereby the external load 6 is placed in ON-state.

In the above embodiment, the transistors are the MOS transistors. Bipolar transistors or other elements may optionally be used. In the above embodiment, the reference voltage generator circuit 2 comprises the band gap reference circuit 21 and the differential amplifier circuit 22. The reference voltage generator circuit 2 may optionally utilize Zener diodes for further simplification of the circuit configuration. In the above embodiment, the level converter circuit 3 has the buffer circuit 35. The level converter circuit 3 may optionally use a waveform shaping circuit operable with a voltage difference between the first power voltage V1 and the reference voltage (V1−V2) from the reference voltage generator circuit 2 in place of the buffer circuit 35.

The gate source withstand voltages of all of the transistors in the power controller are suppressed at about the second low power voltage level V2. Any additional process for forming an additional gate oxide film which increases the withstand voltage up to the first power voltage V1 is unnecessary. For those reasons, the above power controller provides the following advantages, If the output circuit operable at the high voltage V1 and the large scale logic circuit operable at the low voltage V2 are integrated together with each other over a single semiconductor substrate, then the necessary manufacturing processes are less than the conventional power controller, whereby the cost reduction and the size and weight reductions are obtained.

Further, the level converter circuit 3 allows that an additional circuit including the transistors of the gate-source withstand voltage of about the second power voltage level V2 is further provided between the level converter circuit 3 and the output circuit 4 for reducing a noise.

SECOND EMBODIMENT

Figure 6:
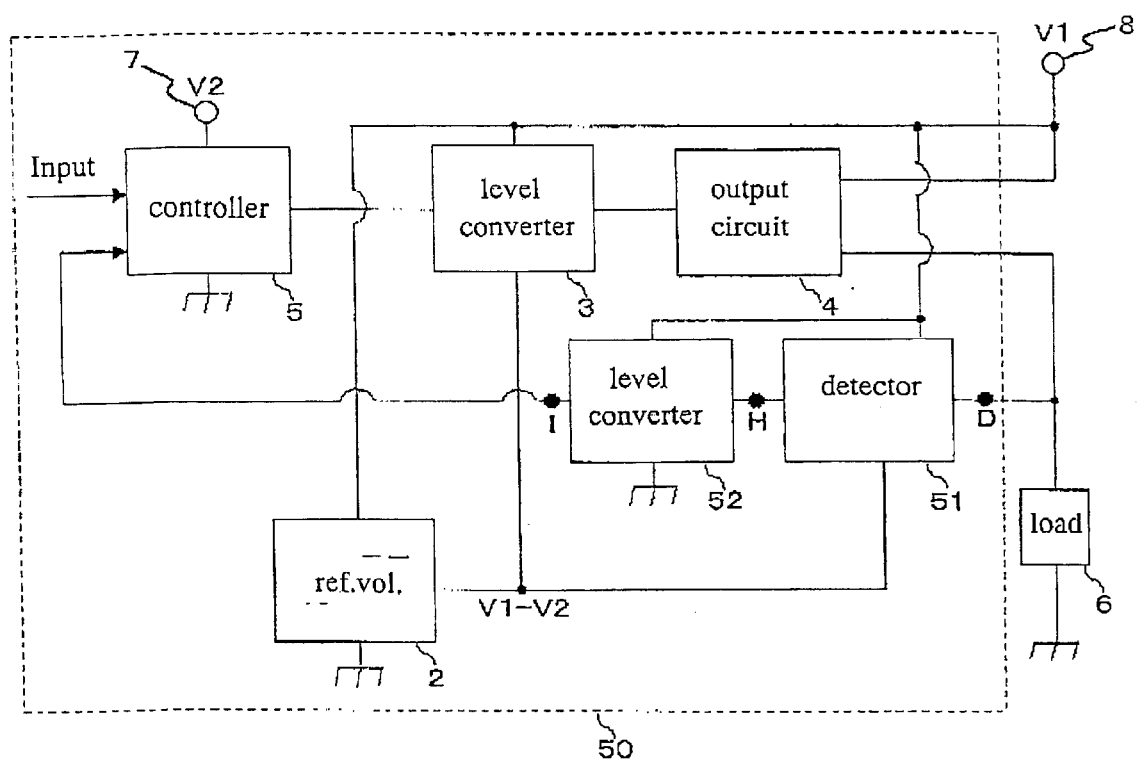
FIG. 6 is a block diagram illustrative of a novel power controller in a second embodiment in accordance with the present invention.

A second embodiment according to the present invention will be described in detail with reference to the drawings. FIG. 6 is a block diagram illustrative of a novel power controller in a second embodiment in accordance with the present invention. A power controller 50 includes a control circuit 5, a reference voltage generator circuit 2, a first level converter circuit 3, an output circuit 4, a second level converter circuit 52, and a failure diagnosis circuit 51 which are integrated on a single semiconductor substrate which is not illustrated.

The control circuit 5, the reference voltage generator circuit 2, the first level converter circuit 3, and the output circuit 4 arc the same as of the first embodiment. In this power controller 50, the second level converter circuit 52, and the failure diagnosis circuit 51 are additionally provided. The failure diagnosis circuit 51 is provided in parallel to the output circuit 4. The second level converter circuit 52 is provided between the failure diagnosis circuit 51 and the control circuit 5.

The failure diagnosis circuit 51 monitors the potential at the node "D" for detecting any failure of the output circuit 5 or a short circuit formation of the external load 6 and generates a detection signal. The second level converter circuit 52 converts a detection signal with the V15–V2 reference from the failure diagnosis circuit 51 at a node "H" into a level-converted failure-detected signal with a 0V-reference and output the level-converted failure-detected signal. This level-converted failure-detected signal is fed back to the control circuit 5. The control circuit 5 receives the level-converted failure-detected signal from the second level converter circuit 52 for placing the output circuit in OFF-state.

Figure 7:
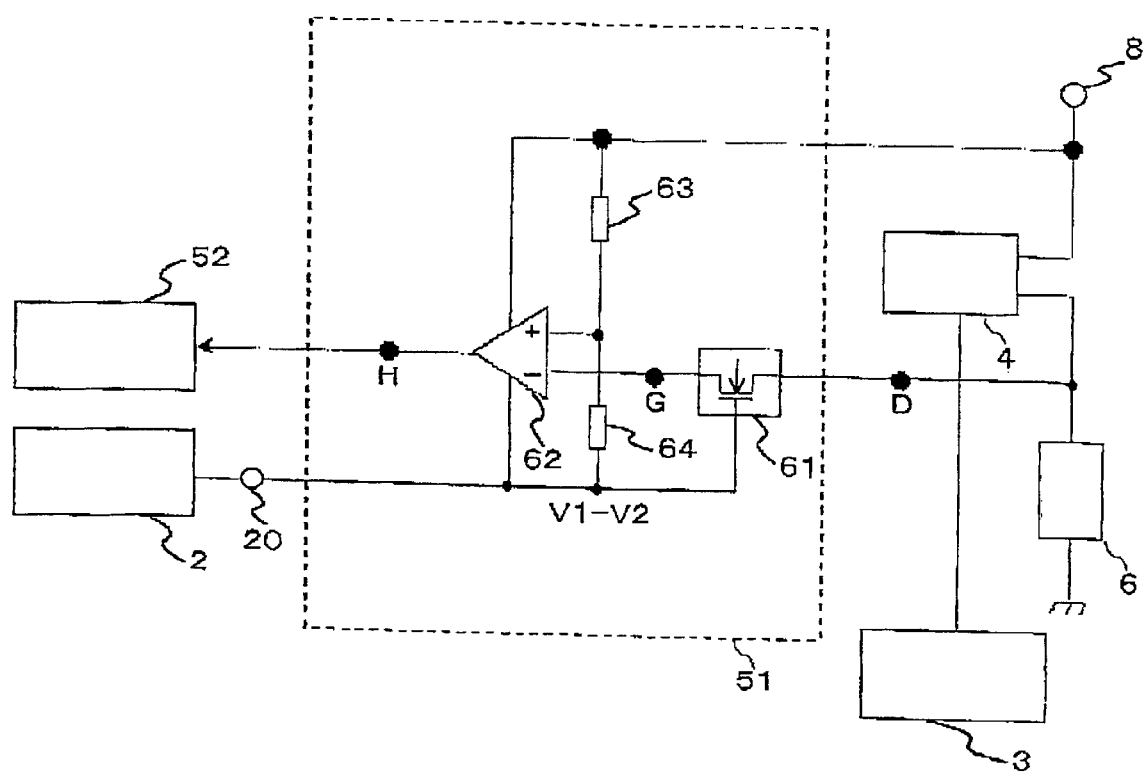
FIG. 7 is a circuit diagram illustrative of a circuit configuration of the failure diagnosis circuit of the power controller of FIG. 6.
Figure 8:
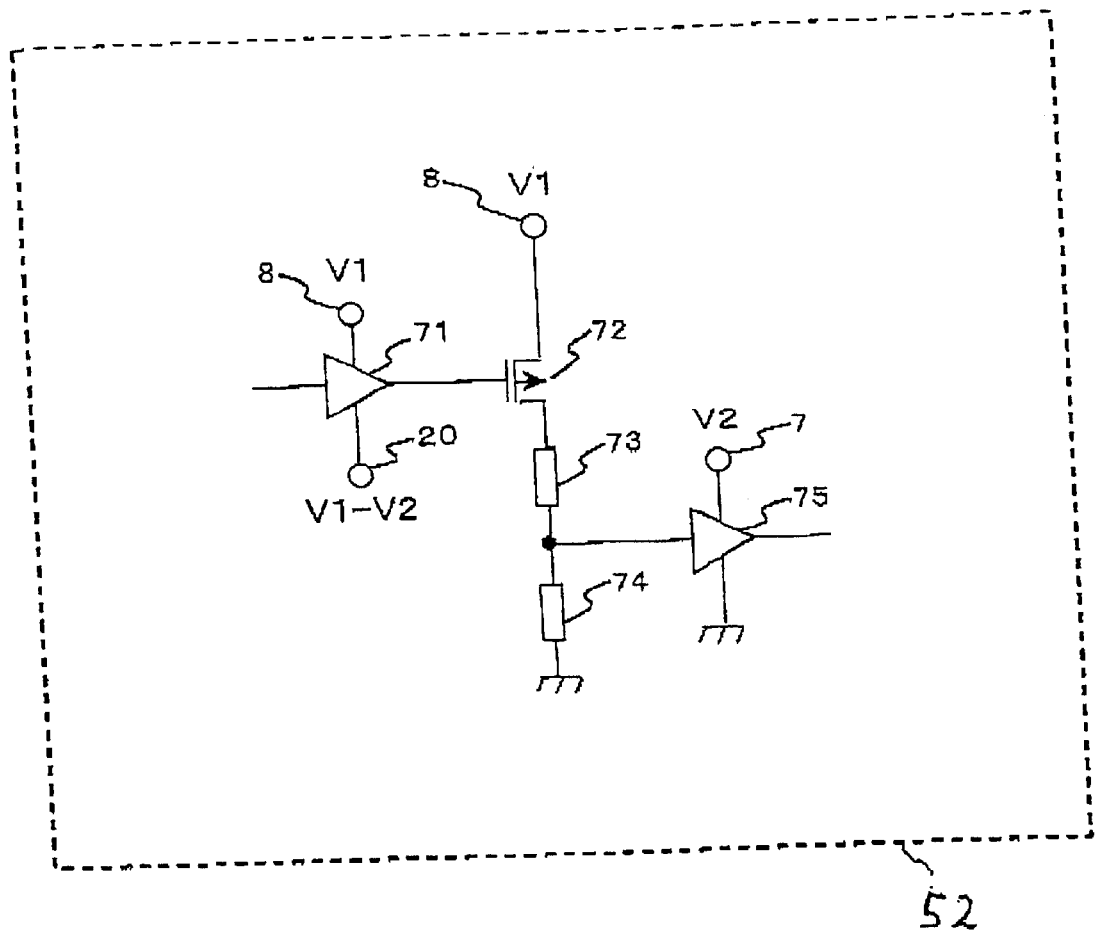
FIG. 8 is a circuit diagram illustrative of a circuit configuration of the second level converter circuit of the power controller of FIG. 6.

The followings are examples of the circuit configurations of the failure diagnosis circuit 51 and the second level converter circuit 52, each of which comprises the transistors having the gate-source withstand voltages higher than the second power voltage V2 by a power voltage variation range. FIG. 7 is a circuit diagram illustrative of a circuit configuration of the failure diagnosis circuit of the power controller of FIG. 6. FIG. 8 is a circuit diagram illustrative of a circuit configuration of the second level converter circuit of the power controller of FIG. 6.

With reference to FIG. 7, the failure diagnosis circuit 51 comprises a comparator circuit 62, two resistances 63 and 64, and a p-channel MOS transistor 61 for providing a lower limit of V1–V2 of the voltage level of the input signal at a node "G" into the comparator circuit 62. A +-power terminal of the comparator circuit 62 is connected to the first power voltage input terminal 8 applied with the first power voltage V1. An –power terminal of the comparator circuit 62 is connected to the output terminal 20 of the reference voltage generator circuit 2 for receiving the virtual reference voltage (V1–V2). The First power voltage terminal 8 is connected through a series connection of the resistances 63 and 64 to the output terminal 20 of the reference voltage generator circuit 2. An intermediate point between the resistances 63 and 64 is connected to a +-input terminal of the comparator circuit 62. An –input terminal of the comparator circuit 62 is connected to a drain of the transistor 61. A source of the transistor 61 is connected to the external load 6. A gate of the transistor 61 is connected to the output terminal 20 of the reference voltage generator circuit 2. An output of the comparator circuit 62 is connected to the second level converter circuit 52.

In the normal operation mode, the output circuit 4 is placed in ON-state. A potential of the node "D" is the first power voltage level V1, whereby the transistor 61 turns ON. A voltage given by V1–V2 appears on the output node "H". If the short circuit formation of the external load 6 or the failure of the output circuit 4 appears, then the potential of the node "G" becomes V1–V2, whereby the transistor 61 turns OFF. A voltage V1 appears on the output node "H", whereby the short circuit formation of the external load 6 or the failure of the output circuit 4 can be detected.

If in the normal operation mode, the output circuit 4 is placed in OFF-state, the operation is different from the above. The potential of the node "G" becomes V1–V2, whereby the transistor 61 turns OFF. A voltage V1 appears on the output node "H". If the short circuit formation of the external load 6 or the failure of the output circuit 4 appears, then a potential of the node "D" is 0V, whereby the transistor 61 turns ON. A voltage given by V1–V2 appears on the output node "H", whereby the short circuit formation of the external load 6 or the failure of the output circuit 4 can be detected.

With reference to FIG. 8, the second level converter circuit 52 comprises two buffer circuits 71 and 75, two resistances 73 and 74 and a single p-channel MOS transistor 72. A +-power terminal of the buffer circuit 75 is connected to the second power input terminal 7 applied with the second power voltage V2. An --power terminal of the buffer circuit 75 is connected to the ground. A series connection of the resistances 73 and 74 and the transistor 72 is interposed between the first power input terminal 8 applied with the first power voltage V1 and the ground. A gate of the transistor 34 is connected to an output of the buffer circuit 71. An intermediate point between the resistances 73 and 74 is connected to an input of the buffer circuit 75. A +-power terminal of the buffer circuit 71 is connected to the first power input terminal 8 applied with the first power voltage V1. An –power terminal of the buffer circuit 71 is connected to the output terminal 20 of the above reference voltage generator circuit 22, so that the –power terminal of the buffer circuit 71 is applied with the voltage given by V1–V2. An input of the buffer circuit 71 is connected to the output of the failure diagnosis circuit 51. An output of the buffer circuit 75 is connected to the control circuit 5.

The second level-converter circuit 52 converts the detected signal with the V1-V2-reference from the failure diagnosis circuit 51 into the level-converted detected signal with the 0V-reference. The second level-converter circuit 52 adjusts the voltage differences between the first power voltage circuit and the second power voltage circuit. As a modification, it is possible that the buffer circuit 71 is not provided, and the detected signal from the failure diagnosis circuit 51 is directly supplied to the gate of the transistor 72.

In the above second embodiment, the failure diagnosis circuit 51 is provided as an additional circuit. It is of course possible to provide another additional circuit with a high voltage level accuracy. It is also possible to further provide an additional differential amplifier circuit to generate a reference voltage for a voltage level which lies between the first power voltage V1 and the reference voltage (V1−V2), so that the generated reference voltage, the first power voltage V1 and the reference voltage (V1−V2) are used for the detection operation.

The power controller 52 provides the following advantages. Two circuits operable with different power voltages are integrated over a single wafer, wherein a detector or a controller which has a high voltage level accuracy, is provided in the high power voltage side, without rendering the circuit configuration complicated.

Although the invention has been described above in connection with several preferred embodiments therefor, it will be appreciated that those embodiments have been provided solely for illustrating the invention, and not in a limiting sense. Numerous modifications and substitutions of equivalent materials and techniques will be readily apparent to those skilled in the art after reading the present application, and all such modifications and substitutions are expressly understood to fall within the true scope and spirit of the appended claims.

What is claimed is:

1. A power controller operable with at least a first power voltage and a second power voltage lower than said first power voltage, said power controller comprising:

a first control signal generator operable with said second power voltage for generating a first control signal;

a first reference voltage generator operable with said first power voltage for generating a first reference voltage which corresponds to a difference between said first and second power voltages;

a first level converter being electrically coupled with said first control signal generator for receiving said first control signal, said first level converter being electrically coupled with said first reference voltage generator for receiving said first reference voltage, said first level converter converting said first control signal into a first level-converted control signal with a voltage level range between said first power voltage and said difference between said first and second power voltages; and a first driver electrically coupled with said first level converter for receiving said first level-converted control signal, and said first driver driving an external load in accordance with said first level-converted control signal.

2. The power controller as claimed in claim 1, wherein said first reference voltage generator includes a band gap reference circuit.

3. The power controller as claimed in claim 1, further comprising a detector electrically coupled with said first reference voltage generator for receiving said first reference voltage, and said detector being biased between said first power voltage and said first reference voltage for performing a detecting operation.

4. The power controller as claimed in claim 3, wherein said detector is electrically coupled with said first driver and said external load for detecting states of said first driver and said external load.

5. The power controller as claimed in claim 3, further comprising a second level converter being electrically coupled with said detector for receiving a detected signal, and said second level converter converts a level-converted detected signal with a voltage level range between a ground level and said second power voltage level.

6. The power controller as claimed in claim 5, wherein said second level converter being electrically coupled with said first control signal generator for supplying said level-converted detected signal to said first control signal generator.

7. The power controller as claimed in claim 1, further comprising a waveform shaping circuit electrically coupled between said first level converter and said first driver for shaping said level converted control signal and supplying a waveform-shaped control signal to said first driver.

8. The power controller as claimed in claim 7, wherein said waveform shaping circuit is operated with a bias between said first power voltage and said first reference voltage.

* * * * *